US010005355B2

United States Patent
Brindak et al.

(10) Patent No.: US 10,005,355 B2
(45) Date of Patent: Jun. 26, 2018

(54) INTEGRATED MOUNTING AND COOLING APPARATUS, ELECTRONIC DEVICE, AND VEHICLE

(71) Applicant: General Electric Company, Schenectady, NY (US)

(72) Inventors: Zachary Brindak, Lawrence Park, PA (US); Henry Young, Erie, PA (US); Theodore Brown, Erie, PA (US); Sean Cillessen, Lawrence Park, PA (US); Mark Murphy, Erie, PA (US)

(73) Assignee: General Electric Company, Schenectady, NY (US)

( * ) Notice: Subject to any disclaimer, the term of this patent is extended or adjusted under 35 U.S.C. 154(b) by 650 days.

(21) Appl. No.: 14/604,846

(22) Filed: Jan. 26, 2015

(65) Prior Publication Data

US 2015/0210158 A1    Jul. 30, 2015

Related U.S. Application Data

(60) Provisional application No. 61/932,272, filed on Jan. 28, 2014.

(51) Int. Cl.
*B60K 11/06* (2006.01)
*H05K 7/20* (2006.01)
*B60K 1/00* (2006.01)

(52) U.S. Cl.
CPC .......... *B60K 11/06* (2013.01); *H05K 7/20918* (2013.01); *H05K 7/20927* (2013.01); *B60K 2001/003* (2013.01)

(58) Field of Classification Search
CPC .............. B60K 11/06; F28F 3/02; F28F 3/027
See application file for complete search history.

(56) References Cited

U.S. PATENT DOCUMENTS

| 3,517,300 A | 6/1970 | McMurray |
| 3,867,683 A | 2/1975 | Marchevka |
| 4,709,317 A | 11/1987 | Iizuka et al. |

(Continued)

FOREIGN PATENT DOCUMENTS

| CL | 199800342 | 12/1998 |
| CN | 1164145 A | 11/1997 |

(Continued)

OTHER PUBLICATIONS

Patterson et al., "Pseudo-Resonant Full Bridge DC /DC Converter", IEEE Transactions on Power Electronics, vol. No. 6, Issue No. 4, pp. 671-678, Oct. 1991.

(Continued)

*Primary Examiner* — Jeffrey Shin
(74) *Attorney, Agent, or Firm* — GE Global Patent Operation; John A. Kramer

(57) ABSTRACT

An integrated mounting and cooling apparatus includes a housing body having a first mounting surface configured to receive electronic components to be cooled and a heat dissipation channel extending through the housing body under the first mounting surface. An array of cooling fins is disposed in the heat dissipation channel. The apparatus is configured to serve as a mounting surface for the electronic components, as a housing for the electronic components, and a heat-sink to cool the electronic components.

25 Claims, 6 Drawing Sheets

(56) References Cited

U.S. PATENT DOCUMENTS

| | | | |
|---|---|---|---|
| 4,953,068 A | 8/1990 | Henze | |
| 5,027,264 A | 6/1991 | Dedoncker et al. | |
| 5,208,740 A | 5/1993 | Ehsani | |
| 5,304,846 A | 4/1994 | Azar et al. | |
| 5,305,191 A | 4/1994 | Loftus, Jr. | |
| 5,355,294 A | 10/1994 | Dedoncker et al. | |
| 5,406,185 A | 4/1995 | Strunk | |
| 5,481,449 A | 1/1996 | Kheraluwala et al. | |
| 5,877,646 A | 3/1999 | Joerg | |
| 5,889,668 A | 3/1999 | Schauder et al. | |
| 5,926,012 A | 7/1999 | Takizawa et al. | |
| 6,181,590 B1 | 1/2001 | Yamane et al. | |
| 6,262,896 B1 | 7/2001 | Stancu et al. | |
| 6,335,871 B1 | 1/2002 | Kita et al. | |
| 6,404,655 B1 | 6/2002 | Welches | |
| 6,431,297 B1 | 8/2002 | Nakazawa | |
| 6,863,119 B2 * | 3/2005 | Sugito | F28D 15/0266 165/104.33 |
| 7,088,073 B2 | 8/2006 | Morishita | |
| 7,177,163 B2 | 2/2007 | Eguchi et al. | |
| 7,511,438 B2 | 3/2009 | Melfi | |
| 7,638,904 B2 | 12/2009 | Shoji et al. | |
| 7,768,799 B2 | 8/2010 | Cramer et al. | |
| 7,863,837 B2 | 1/2011 | Tanaka et al. | |
| 8,111,528 B2 | 2/2012 | Wu et al. | |
| 8,165,737 B2 | 4/2012 | Schulz et al. | |
| 8,717,069 B2 | 5/2014 | Curbelo et al. | |
| 8,944,147 B2 * | 2/2015 | Takano | F28F 3/025 165/109.1 |
| 2002/0172061 A1 | 11/2002 | Phadke | |
| 2005/0206438 A1 | 9/2005 | Higashi | |
| 2005/0253165 A1 | 11/2005 | Pace et al. | |
| 2006/0044025 A1 | 3/2006 | Grbovic | |
| 2006/0250828 A1 | 11/2006 | Taylor | |
| 2008/0212340 A1 | 9/2008 | Tao et al. | |
| 2009/0034299 A1 | 2/2009 | Lev | |
| 2009/0107655 A1 * | 4/2009 | Kajiura | F28F 3/025 165/80.3 |
| 2009/0129123 A1 | 5/2009 | Taurand et al. | |
| 2010/0053889 A1 | 3/2010 | Miller et al. | |
| 2010/0090728 A1 | 4/2010 | Logiudice et al. | |
| 2010/0182803 A1 | 7/2010 | Nan et al. | |
| 2010/0315780 A1 * | 12/2010 | Murakami | H01L 23/473 361/699 |
| 2011/0085363 A1 | 4/2011 | Gupta et al. | |
| 2011/0209863 A1 | 9/2011 | Jonsson et al. | |
| 2011/0249472 A1 | 10/2011 | Jain et al. | |
| 2011/0273206 A1 | 11/2011 | Lee | |
| 2012/0014138 A1 | 1/2012 | Ngo et al. | |
| 2012/0019287 A1 | 1/2012 | Brumett, Jr. et al. | |
| 2012/0160460 A1 | 6/2012 | Oikawa | |
| 2013/0044519 A1 | 2/2013 | Teraura et al. | |
| 2013/0099581 A1 | 4/2013 | Zhou et al. | |
| 2013/0153186 A1 * | 6/2013 | Gotou | H01L 23/473 165/168 |
| 2013/0308344 A1 | 11/2013 | Rosado et al. | |
| 2014/0077611 A1 | 3/2014 | Young et al. | |
| 2014/0078782 A1 | 3/2014 | Rosado et al. | |
| 2015/0349649 A1 | 12/2015 | Zane et al. | |
| 2016/0001660 A1 | 1/2016 | Tomura et al. | |
| 2016/0020702 A1 | 1/2016 | Trescases et al. | |

FOREIGN PATENT DOCUMENTS

| | | |
|---|---|---|
| CN | 1047895 C | 12/1999 |
| CN | 1671049 A | 9/2005 |
| CN | 1874126 A | 12/2006 |
| CN | 1874128 A | 12/2006 |
| CN | 101088221 A | 12/2007 |
| CN | 102237781 A | 11/2011 |
| EP | 0633652 A2 | 1/1995 |
| EP | 1014550 A2 | 6/2000 |
| EP | 1105970 A1 | 6/2001 |
| EP | 1684565 A1 | 7/2006 |
| EP | 1998432 A2 | 12/2008 |
| JP | 07264862 A | 10/1995 |
| JP | 07321487 A | 12/1995 |
| JP | 2008543271 A | 11/2008 |
| JP | 2010068576 A | 3/2010 |
| JP | 2011234541 A | 11/2011 |
| JP | 2012044801 A | 3/2012 |
| JP | 2013027201 A | 2/2013 |
| JP | 2014060913 A | 4/2014 |
| JP | 2014193090 A | 10/2014 |
| TW | 201039541 A | 11/2010 |

OTHER PUBLICATIONS

Schibli, "Symmetrical Multilevel Converters With Two Quadrant DC-DC Feeding", Ecole Polytechnique Federale De Lausanne, Thesis No. 2220, pp. 1-285, Jan. 2000.

Chan et al., "Phase-Shift Controlled DC-DC Convertor with Bi-Directional Power Flow", IEE Proceedings-Electric Power Applications, vol. No. 148, Issue No. 2, pp. 193-201, Mar. 2001.

Krismer et al., "Performance Optimization of a High Current Dual Active Bridge with a Wide Operating Voltage Range", Power Electronics Specialists Conference, 2006 37th IEEE, pp. 1-7, Jun. 18-22, 2006.

Bai et al., "Eliminate Reactive Power and Increase System Efficiency of Isolated Bidirectional Dual-Active-Bridge DC-DC Converters Using Novel Dual-Phase-Shift Control", IEEE Transactions on Power Electronics, vol. No. 23, Issue No. 6, pp. 2905-2914, Nov. 2008.

Oggier et al., "Switching Control Strategy to Minimize Dual Active Bridge Converter Losses", IEEE Transactions on Power Electronics, vol. No. 24, Issue No. 7, pp. 1826-1838, Jul. 2009.

Jain et al., "PWM Control of Dual Active Bridge: Comprehensive Analysis and Experimental Verification", IEEE Transactions on Power Electronics, vol. No. 26, Issue No. 4, pp. 1215-1227, Apr. 2011.

Everts et al., "Switching Control Strategy for Full ZVS Soft-Switching Operation of a Dual Active Bridge AC/DC Converter", Applied Power Electronics Conference and Exposition (APEC), 2012 Twenty-Seventh Annual IEEE, pp. 1048-1055, Feb. 5-9, 2012.

PCT Search Report and Written Opinion issued in connection with related PCT Application No. PCT/US2013/039277 dated Jun. 28, 2013.

PCT Search Report and Written Opinion issued in connection with related PCT Application No. PCT/US2013/033203 dated Jul. 18, 2013.

U.S. Non-Final Office Action issued in connection with related U.S. Appl. No. 13/454,292 dated Jul. 19, 2013.

U.S. Final Office Action issued in connection with related U.S. Appl. No. 13/454,292 dated Sep. 24, 2013.

U.S. Non-Final Office Action issued in connection with related U.S. Appl. No. 13/475,550 dated Nov. 4, 2014.

PCT Preliminary Report on Patentability issued in connection with related PCT Application No. PCT/US2013/033203 dated Nov. 6, 2014.

PCT Preliminary Report on Patentability issued in connection with related PCT Application No. PCT/US2013/039277 dated Nov. 27, 2014.

U.S. Final Rejection issued in connection with related U.S. Appl. No. 13/475,550 dated Jun. 5, 2015.

Japanese Office Action issued in connection with related JP Application No. 2015512675 dated Oct. 20, 2015.

Unofficial English Translation of Chile Office Action issued in connection with related CL Application No. 28152014 dated Dec. 14, 2015.

AU Examination Report issued in connection with related AU Application No. 2013252840 dated Feb. 22, 2016.

AU Examination Report issued in connection with related AU Application No. 2013263196 dated Feb. 29, 2016.

Unofficial English Translation of Chile Office Action issued in connection with related CL Application No. 201402895 dated Apr. 11, 2016.

(56) References Cited

OTHER PUBLICATIONS

European Search Report and Opinion issued in connection with related EP Application No. 15195324.7 dated Apr. 12, 2016.
Unofficial English Translation of Chile Office Action issued in connection with related CL Application No. 28152014 dated May 16, 2016.
Unofficial English Translation of Japanese Notice of Allowance issued in connection with related JP Application No. 2015512675 dated Jun. 14, 2016.
Unofficial English Translation of Chinese Office Action issued in connection with related CN Application No. 201380021789.2 dated Jun. 29, 2016.
Australian Notice of Acceptance issued in connection with related AU Application No. 2013263196 dated Sep. 5, 2016.
Australian Notice of Acceptance issued in connection with related AU Application No. 2013252840 dated Sep. 12, 2016.
Unofficial English Translation of CL Office Action issued in connection with related CL Application No. 201402895 dated Dec. 12, 2016.
Unofficial English Translation of Japanese Search Report issued in connection with related JP Application No. 2015225310 dated Dec. 12, 2016.
U.S. Final Office Action issued in connection with related U.S. Appl. No. 14/547,178 dated Jan. 13, 2017.
Unofficial English Translation of Japanese Office Action issued in connection with related JP Application No. 2015225310 dated Jan. 24, 2017.
U.S. Non-Final Office Action issued in connection with related U.S. Appl. No. 14/547,178 dated Apr. 21, 2017.
Unofficial English Translation of Chile Office Action issued in connection with corresponding CL Application No. 201500221 due on May 5, 2017.
European Office Action issued in connection with related EP Application No. 15195324.7 dated May 15, 2017.

\* cited by examiner

US 10,005,355 B2

INTEGRATED MOUNTING AND COOLING APPARATUS, ELECTRONIC DEVICE, AND VEHICLE

CROSS-REFERENCE TO RELATED APPLICATIONS

This application claims priority to U.S. Provisional Application No. 61/932,272 filed 28 Jan. 2014, which is hereby incorporated by reference herein in its entirety.

FIELD OF THE INVENTION

Embodiments of the invention relate generally to cooling systems. Other embodiments relate to cooling systems for control and power electronics of a vehicle.

BACKGROUND OF THE INVENTION

Large off-highway vehicles ("OHVs"), such as mining vehicles used to haul heavy payloads excavated from open pit mines, may employ motorized wheels for propelling or retarding the vehicle in an energy efficient manner. In some such vehicles, this efficiency is obtained by employing a large-horsepower diesel engine in conjunction with an alternator and an electric drive system, which may include a main traction inverter and a pair of wheel drive assemblies housed within the rear tires of the vehicle. A drive shaft of the diesel engine is mechanically coupled to the alternator, for driving the alternator to generate electricity. The electricity generated by the alternator is routed to the main traction inverter, which supplies electrical power having a controlled voltage and frequency to electric drive motors of the two wheel drive assemblies. Each wheel drive assembly houses a planetary gear transmission that converts the rotation of the associated drive motor energy into a high-torque, low-speed rotational energy output which is supplied to the rear wheels.

Power converters suitable for use with OHVs include, for example, isolated bidirectional H-bridge converters that feature two full semiconductor bridges connected through a power transformer. Such converters can transfer power in both directions with voltages at primary and secondary sides varying within a range, and may include power elements that are switched on and off by drive circuitry in an alternating fashion to produce an output AC waveform. The power elements may include insulated gate bipolar transistors (IGBTs), power BJT transistors, power MOSFETs, integrated gate commutated thyristors (IGCT), gate turn-off thyristors (GTO), or the like.

As will be readily appreciated, therefore, OHVs and other vehicles may contain power and control electronics which are utilized to control and manage the conversion of mechanical energy into electrical energy and to control the supply of electrical power to the traction motors of the vehicle. These power and control electronics also require packaging systems to mount and protect the components thereof, and cooling systems to maximize lifespan and to ensure proper operation thereof.

Existing systems and methods for packaging and cooling power and control electronics typically rely on packaging the power and control electronics within plastic housing assemblies and cooling the components utilizing an external heatsink that is installed separately. Such existing systems and methods for packaging and cooling power and control electronics, however, may be costly, tedious to assemble, and prone to tolerance stack-up issues.

BRIEF DESCRIPTION OF THE INVENTION

In an embodiment, an apparatus (e.g., a mounting and cooling apparatus for electronic components of an electronic device) includes a housing and an array of cooling fins. The housing includes a housing body that defines a first mounting surface configured to receive plural electronic components to be cooled. The housing body also defines a heat dissipation channel that extends through the housing body under the first mounting surface. The array of cooling fins is disposed in the heat dissipation channel. The housing body is configured, when the apparatus is installed as part of an electronic device with the plural electronic components affixed to the mounting surface, to conduct heat from the electronic components to the cooling fins for dissipation of the heat from the cooling fins to a first cooling fluid (e.g., air) that passes through the heat dissipation channel.

According to one aspect, the housing body may be a monolithic metal body, formed for example by casting or machining, which serves as a mounting surface for the electronic components, a housing for the electronic components, and a heat sink to cool the electronic components.

BRIEF DESCRIPTION OF THE DRAWINGS

The present invention will be better understood from reading the following description of non-limiting embodiments, with reference to the attached drawings, wherein below.

DETAILED DESCRIPTION OF THE INVENTION

Figure 1:
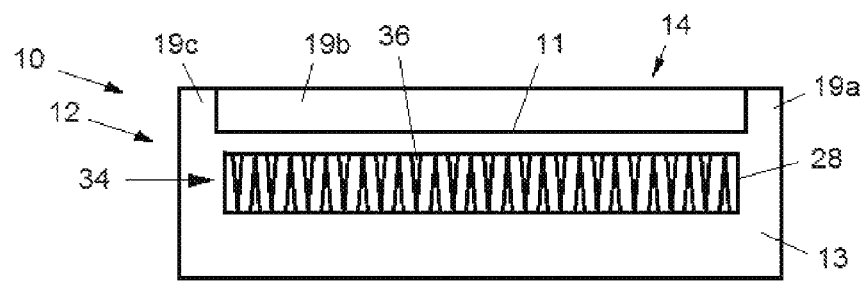
FIG. 1 is a schematic front side elevation view of a mounting and cooling apparatus according to an embodiment of the invention.

Reference will be made below in detail to exemplary embodiments of the invention, examples of which are illustrated in the accompanying drawings. Wherever possible, the same reference numerals used throughout the drawings refer to the same or like parts. Although embodiments of the invention are described with respect to control and power electronics for vehicles, embodiments are equally applicable to control and power electronics generally, and for any type of vehicle or machinery that employs such control and power electronics. For example, electronic devices incorporating aspects of the invention may be applicable for use in rail vehicles, mining haul trucks, underground machinery utilized in the mining industry, marine vessels, stationary generators, hydraulic fracturing rigs, etc. As used herein, "electronic component" refers to a device configured to affect electricity or its related fields. "Power electronic component" refers to such a component that is configured for the control and/or conversion of electric power. Examples include certain diodes, IGBTs and other transistors, bus bars, capacitors, etc. "Control electronic component" refers to such a component that is configured to control the conversion or transfer of electric power. Examples include control cards, current and voltage sensors, gate drivers for switching transistors, etc. Power electronic components may operate at a relatively higher power rating (e.g., hundreds of volts and tens of amperes or more) than control electronic components (e.g., milliamps and millivolts). "Electronic device" refers to a device that includes electronic components.

Embodiments of the invention relate to an apparatus for an electronic device, which serves as (i) a housing for electronic components of the electronic device, (ii) a heat sink to cool the electronic components, and (iii) a mounting surface for the electronic components. For example, an apparatus may include a housing body (e.g., monolithic metal body) and an array of cooling fins. The housing body defines a mounting surface configured to receive plural electronic components, and a heat dissipation channel that extends through the body under the first mounting surface. The array of cooling fins is disposed in the heat dissipation channel. The mounting surface may be located in a recess in the body, which can be covered with a cover to enclose the electronic components. In operation, when the apparatus is deployed for use as part of an electronic device (with the electronic components mounted to the mounting surface and appropriately interconnected in a circuit), heat from the electronic components is conducted through the housing body and to the cooling fins, for transfer to a cooling fluid (e.g., air) that passes through the heat dissipation channel.

Figure 2:
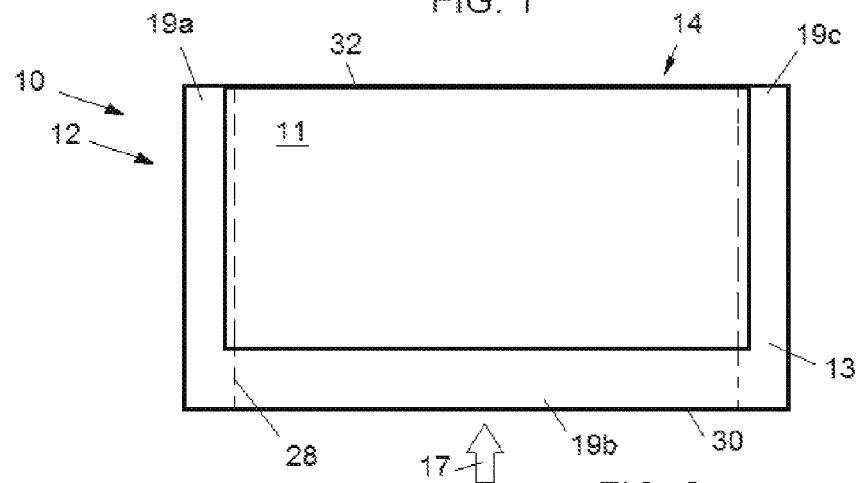
FIG. 2 is a schematic top plan view of the apparatus of FIG. 1.
Figure 3:
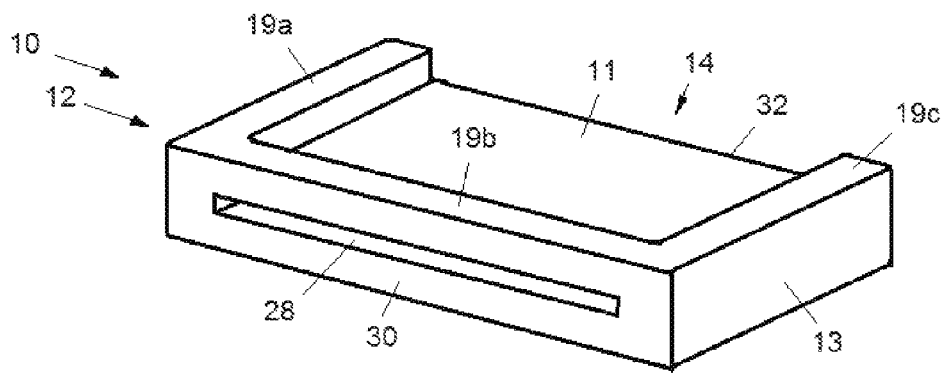
FIG. 3 is a schematic perspective view of the apparatus of FIG. 1.

FIGS. 1-3 show a first embodiment of an apparatus 10 for an electronic device, which services as a heat sink, mounting surface, and housing for electronic components of the electronic device. The apparatus 10 includes a housing 12 having a housing body 13. The housing body 13 defines a first mounting surface 11 configured to receive plural first electronic components (see, e.g., components 22 shown in FIG. 9, as discussed below) to be cooled. That is, the mounting surface 11 is dimensioned for the plural electronic components to be attached thereto, e.g., in a co-planar relationship. The housing body 13 also defines a heat dissipation channel 28 that extends through the housing body under the first mounting surface 11. The apparatus 10 further includes an array 34 of cooling fins 36 disposed in the heat dissipation channel 28. The housing body 13 is configured, when the apparatus is part of an electronic device and the electronic device is in operation, to conduct heat from the electronic components to the cooling fins 36 for transfer of the heat from the cooling fins 36 to a first cooling fluid 17 (e.g., air) that passes through the heat dissipation channel 28.

In an embodiment, the housing body 13 is a metal body, that is, the housing body is comprised of a metal. In another embodiment, the housing body is a monolithic metal body, formed, for example, by casting or machining. Thus, in such an embodiment, the body is comprised of a metal, and all parts of the body are formed of the same piece (block or casting) of the metal. In either case (monolithic metal body, or a metal body more generally), the metal may be silver, copper, aluminum, or another metal having a relatively high thermal conductivity, or alloys thereof. The cooling fins 36 may be made of a different (or the same) material and attached to the housing body 13. Alternatively, if the housing body is a monolithic metal body, the cooling fins 36 may be integral with the monolithic metal body, e.g., cast, machined, or otherwise formed along with the monolithic metal body, such that the fins and housing body are formed of the same piece of metal.

In another embodiment (applicable to where the housing includes a monolithic metal housing body, a metal housing body more generally, or a housing body more generally still), the first mounting surface 11 is planar. The housing body 13 is generally rectangular cuboid-shaped, meaning it includes top and bottom sides, front 30 and rear 32 sides, and left and right sides, each of which includes a respective planar portion and four edges at least portions of which are straight. The housing body defines a first cavity or recess 14 in the top side. The first recess 14 is at least partially bound by the first mounting surface 11 and at least two top sidewalls 19a, 19b, 19c that are perpendicular to the first mounting surface 11. (FIGS. 1-3 show an embodiment having three sidewalls, but the housing body could include two sidewalls 19a, 19c, or four sidewalls, e.g., sidewalls 19a, 19b, 19c and a fourth side wall similar to sidewall 19b but connecting the open ends of the sidewalls 19a, 19c.) The top sidewalls are part of at least two of the front and rear sides and left and right sides of the housing body. The heat dissipation channel 28 extends through the housing body 13 from the front side to the rear side under the first mounting surface 11. To facilitate heat transfer from the electronic components to the cooling fins, the heat dissipation channel may be substantially coextensive with the first mounting surface, meaning from a top plan perspective (see, e.g., FIG. 2), the heat dissipation channel is at least 75% coextensive with the first mounting surface. The heat dissipation channel may be generally rectangular cuboid-shaped.

Figure 4:
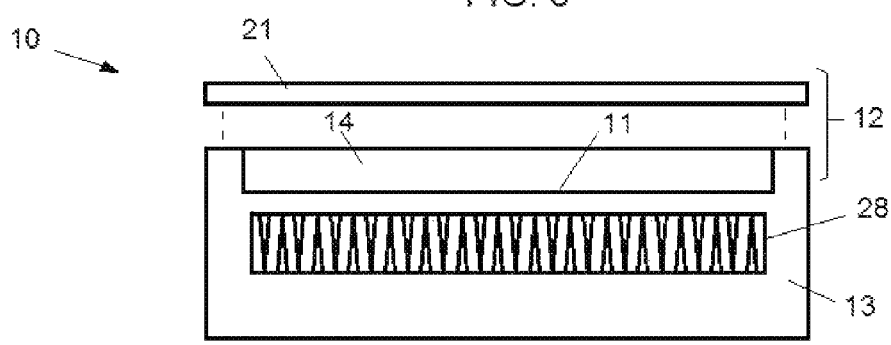
FIG. 4 is a schematic front side elevation view of another embodiment of a mounting and cooling apparatus.

In another embodiment, with reference to FIG. 4, the housing 12 further includes a first cover 21 that is configured for connection to top edges of the top sidewalls 19a, 19b, 19c, at the top side of the housing body, for at least partially enclosing the first recess 11 when the cover is attached to the housing body.

Figure 5:
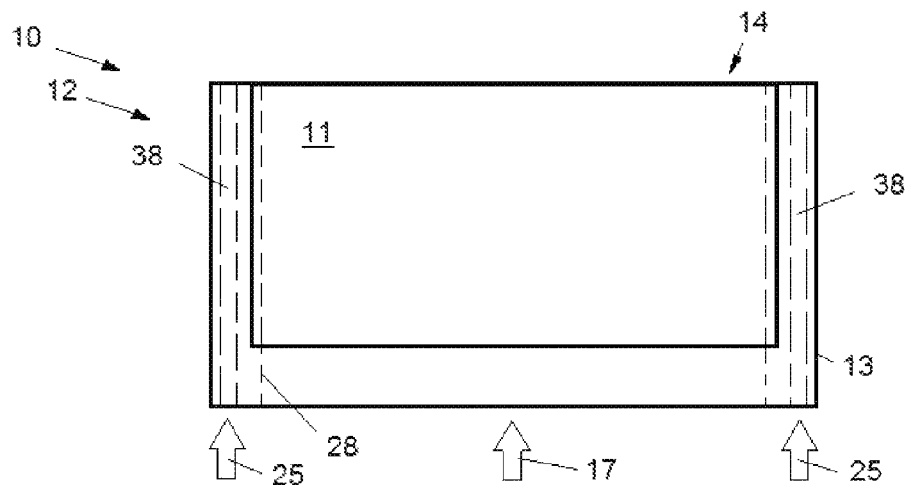
FIG. 5 is a schematic top plan view of another embodiment of a mounting and cooling apparatus.
Figure 6:
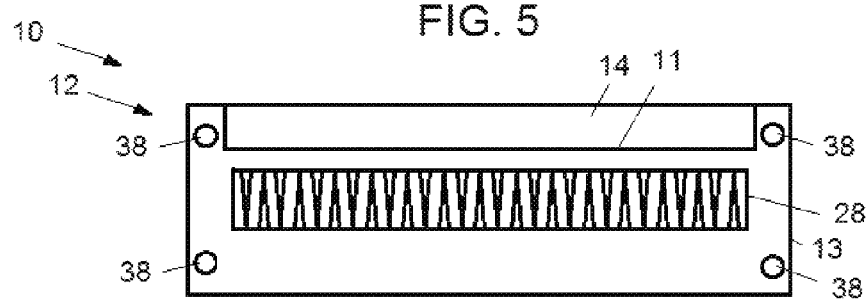
FIG. 6 is a schematic front side elevation view of the apparatus of FIG. 5.

In another embodiment, with reference to FIGS. 5 and 6, the housing body 13 defines at least one cooling channel 38 extending through the housing body. The cooling channel (or channels) may be configured to receive a second cooling fluid 25 that is different, and/or fluidly isolated, from the first cooling fluid 17. For example, the second cooling fluid 25 may be a liquid (received from, and returned to, for example, a vehicle engine coolant system), and the first cooling fluid may be air (for example, received from a blower and returned to ambient). The cooling channels may extend through the housing body from one side to another side thereof (e.g., from the front side to the rear side), and they may be formed as part of the housing body through a casting process (for example), or machined into the housing body as through-bores, for example, by a drilling operating. The cooling channels 38 may encase cooling pipes 40 (see FIG. 10), which receive the second cooling fluid, e.g., the cooling pipes may be made of a material that is different than the housing body material and that provides different material properties in terms of interaction with the second cooling fluid (corrosion resistance for example).

Figure 7:
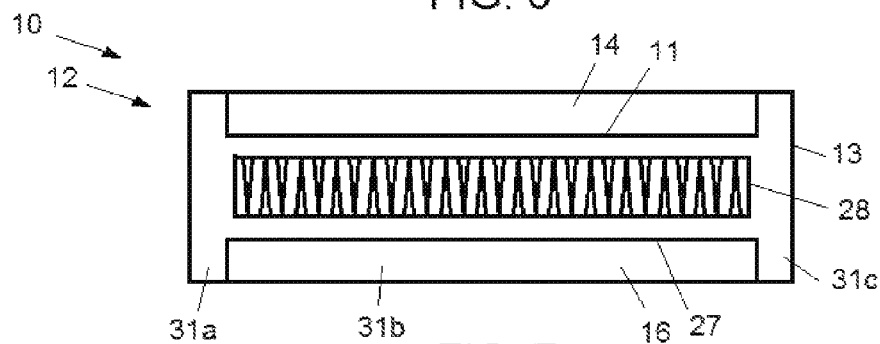
FIG. 7 is a schematic front side elevation view of another embodiment of a mounting and cooling apparatus.

In another embodiment (again, applicable to where the housing includes a monolithic metal housing body, a metal housing body more generally, or a housing body more generally still), turning to FIG. 7, the housing body 13 defines a second mounting surface 27 configured to receive plural second electronic components 29 (shown in other figures, as discussed below) to be cooled. The second mounting surface 27 is arranged over the heat dissipation channel 28 opposite the first mounting surface, that is, the first mounting surface is on the top side of the housing body and the second mounting surface is on the bottom side of the housing body, with the heat dissipation channel lying between the two. The housing body may define first and second recesses 14, 16, with the first mounting surface 11 and the second mounting surface 27 positioned within the first and second recesses 14, 16, respectively. The second mounting surface 27 may be planar.

In an embodiment where the housing body has first and second mounting surfaces within first and second recesses, the second recess may be at least partially bound by the second mounting surface and at least two bottom sidewalls 31a, 31b, 31c that are perpendicular to the second mounting surface. The bottom sidewalls 31a, 31b, 31c are part of at least two of the front and rear sides and left and right sides of the monolithic metal body. The heat dissipation channel may be disposed under the second mounting surface and substantially coextensive with the second mounting surface.

Figure 8:
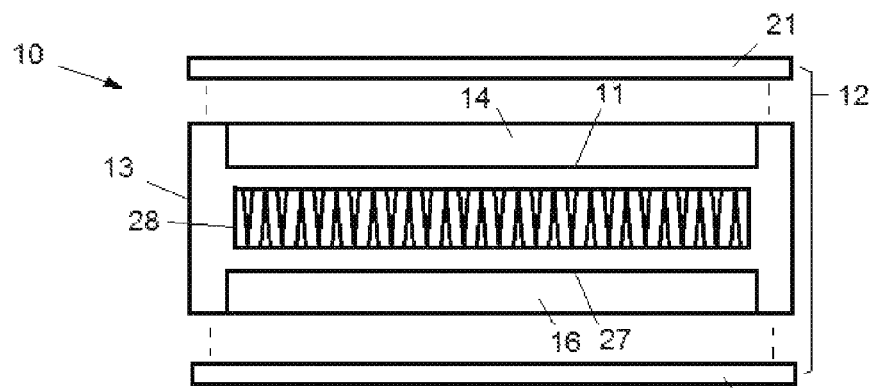
FIG. 8 is a schematic front side elevation view of another embodiment of a mounting and cooling apparatus.

In another embodiment where the housing body has first and second mounting surfaces within first and second recesses, with reference to FIG. 8, the housing further comprises a first cover 21 configured for connection to top edges of the top sidewalls, at the top side of the housing body, for at least partially enclosing the first recess 14, and a second cover 33 configured for connection to top edges of the bottom sidewalls, at the bottom side of the housing body, for at least partially enclosing the second recess 16.

In any of the embodiments herein, the first and/or second recesses 14, 16 may be generally rectangular cuboid-shaped, and may occupy, from a top plan perspective (see, e.g., FIG. 2), at least 70% (and in another embodiment, at least 80%) of the top plan area of the housing body. This maximizes (or at least increases) the number of electronic devices that can be accommodated within the recesses for a given housing/apparatus size.

In embodiments of the housing body with two mounting surfaces, for example as shown in FIGS. 7 and 8, the housing body may include cooling channels 38, for example as shown in FIGS. 5 and 6.

Another embodiment relates to an electronic device (e.g., power supply, power converter, or the like) that includes an apparatus 10 as described herein. The electronic device further includes plural first electronic components affixed to the first mounting surface of the housing body of the apparatus 10. If the housing body additionally includes a second mounting surface, the electronic device may further include plural second electronic components affixed to the second mounting surface. The first electronic components (and the second electronic components, if present) may be electrically interconnected in an operational circuit. A power output of the electronic device, in at least one mode of operation, may be from 10 kW to 3000 kW. This reflects that in embodiments, the apparatus 10 accommodates relatively large, high-power electronic components (power transistors or the like) that operate at relatively high power levels (tens of amperes and hundreds of volts or more), for mounting, housing, and cooling.

Figure 9:
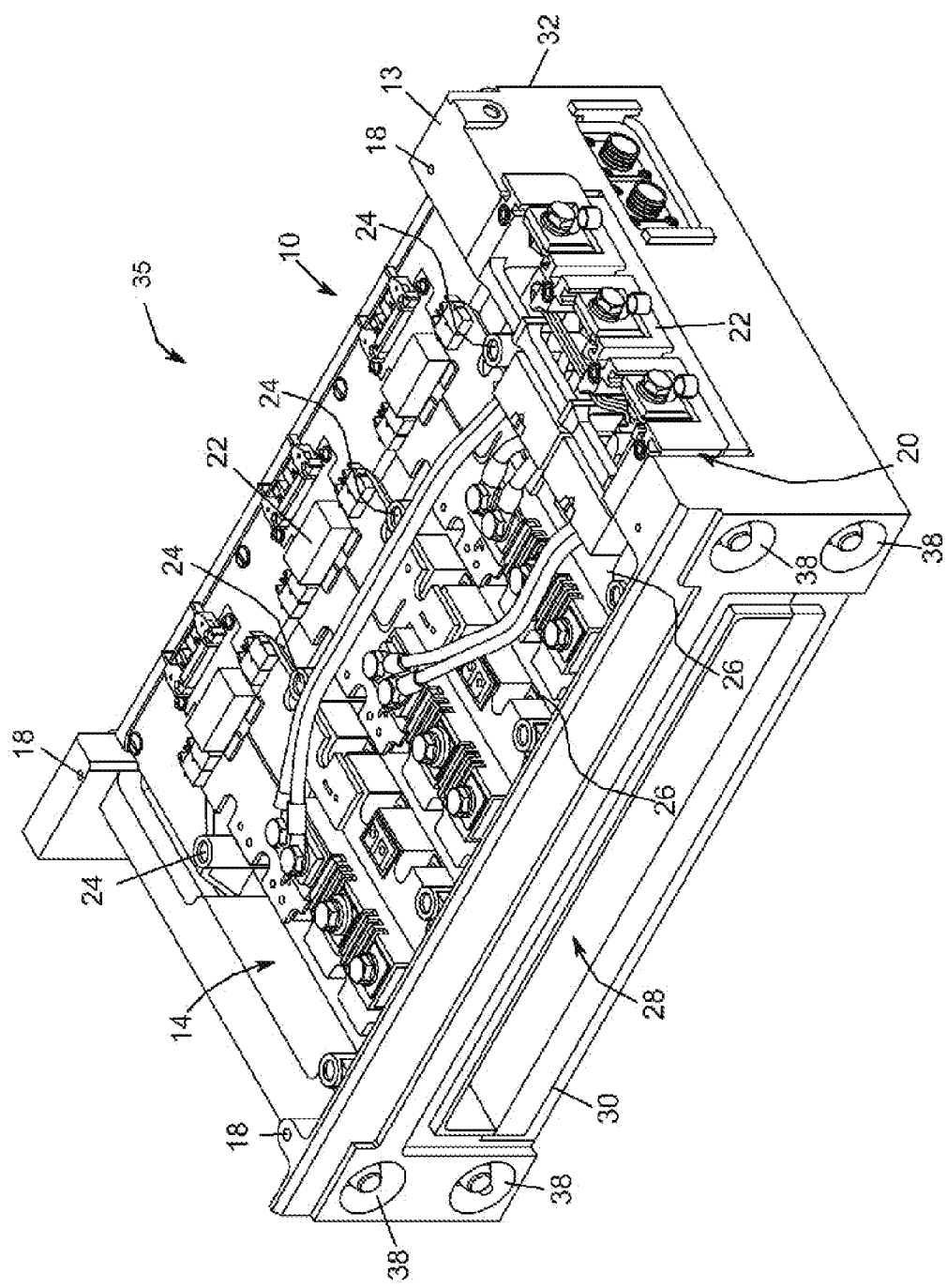
FIG. 9 is a top perspective view of an electronic device, according to an embodiment of the invention.
Figure 10:
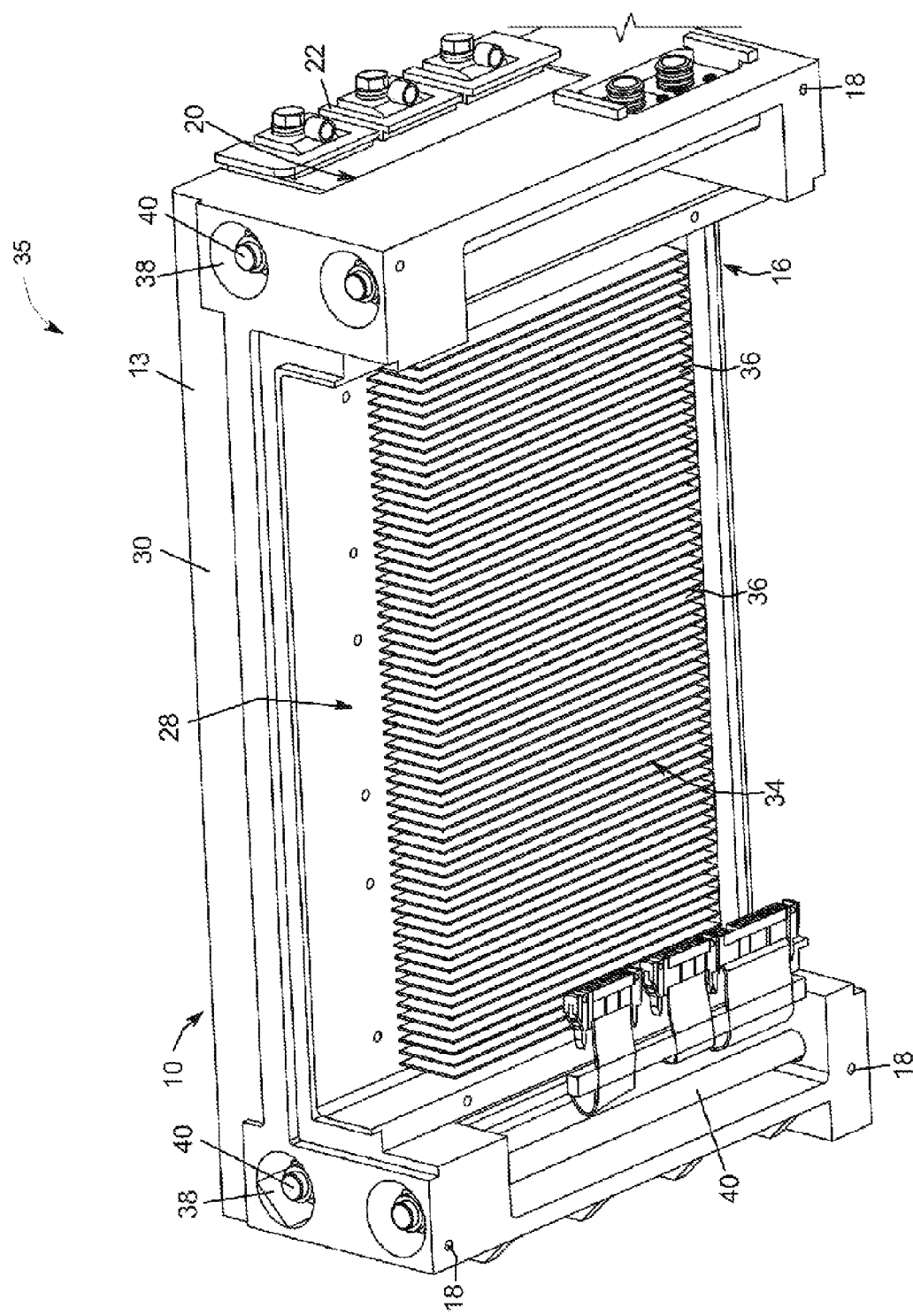
FIG. 10 is a bottom perspective view of the electronic device of FIG. 9 (partly in cutaway to show internal components)
Figure 11:
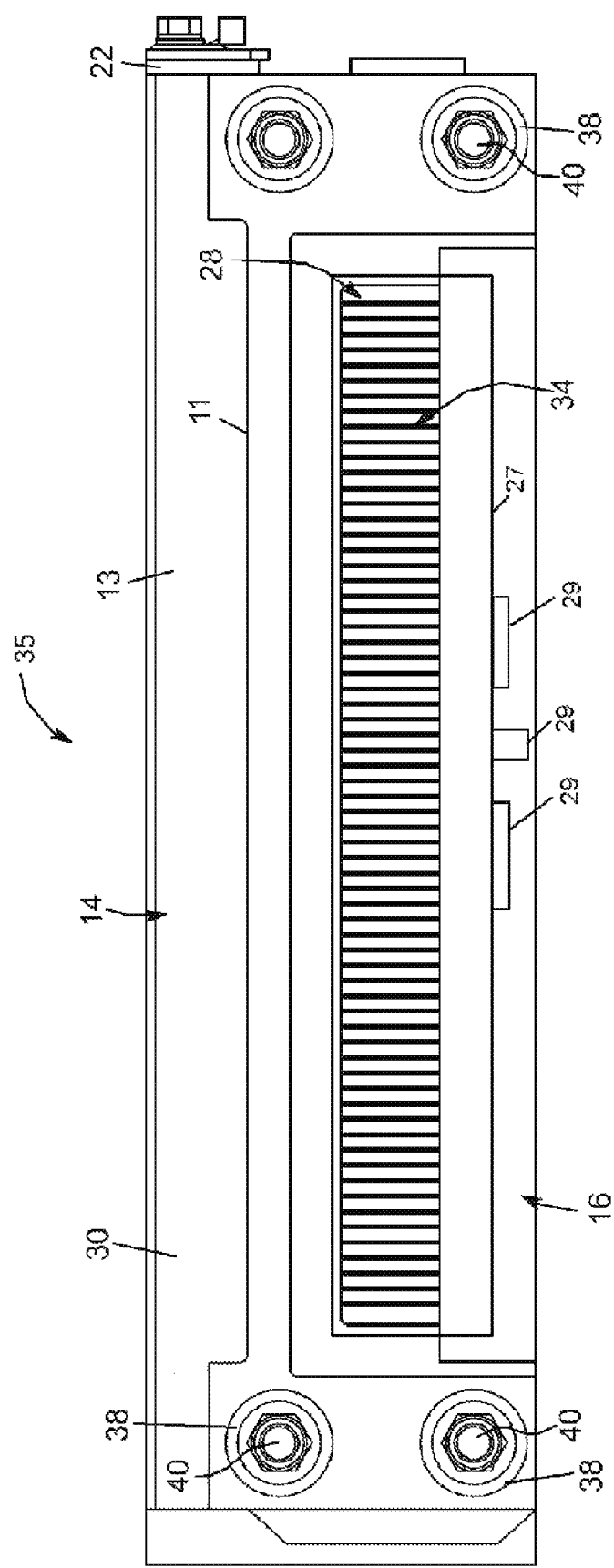
FIG. 11 is a rear side elevation view of the electronic device of FIG. 9.

FIGS. 9-11 show embodiments of such an electronic device 35. The electronic device 35 includes the apparatus 10, which in turn includes the housing body 13 having a substantially open top side that defines the first mounting surface 11 and the first recess 14. The electronic device 35 further includes plural first electronic components 22 affixed to the first mounting surface 11. The housing body 13 may also have a substantially open bottom side that defines the second mounting surface 27 and the second recess 16, and the electronic device may further include plural second electronic components 29 affixed to the second mounting surface 27 (see FIG. 11). The first and/or second electronic components may be the same type of component, or there may be different electronic components, e.g., IGBT modules, bus bars, capacitors, or the like. Thus, "first" and "second" are merely labels to differentiate groups of components, and do not necessarily mean the components are all the same as one another; in most electronic devices, there will be a mix of components that are interconnected in a circuit to perform, when provided with a power source, one or more designated functions, such as converting electrical power from one form to another. The electronic components may include power components (rated for handling relatively higher power levels), control components (components for controlling power components), small-signal components (rated for handling relatively smaller power levels), and/or mixes thereof.

In an embodiment, the electronic device 35 includes all or part of an H-bridge power converter that is configured, in at least one mode of operation, to convert an electrical input to a different electrical output (e.g., as noted above, a power output from 10 kW to 3000 kW). Examples of H-bridge power converters are found in U.S. Publication No. 2013/0308344 A1 dated Nov. 21, 2013, which is hereby incorporated by reference herein in its entirety.

In an embodiment, the first and second recesses 14, 16 of the electronic device 35 are fully or at least substantially enclosable by covers (see covers 21, 33 as shown in FIG. 8) that can be secured to the housing body 13 via mounting apertures 18.

As best shown in FIG. 9, the apparatus 10 may include various structural features for receiving and mounting various electronic components 22, 29 to be cooled. (The structural features for performing this function as referred to generally as "mounts.") The mounts may include threaded posts 24 and seats 26 corresponding to the shapes of the various electronic components to be affixed to the housing body 13. The electronic components may be mounted to the housing body 13 with screws or other fasteners, adhesives, solder, or the like. One or both of the first and second recesses 14, 16 (i.e., mounting surfaces and associated sidewalls) may be provided with mounts, and/or the first and second recesses may have the same configuration of mounts, or different configurations of mounts. In an embodiment, the threaded posts 24, seats 26, and other mounts are integrally formed with the housing body 13. For example, the housing body 13, including the recesses 14, 16 and mounts, may be cast as a single, integral unit (e.g., a monolithic metal body). Alternatively or additionally, the housing body 13 may include one or more cutouts or sidewall apertures 20 in one or more of the sides of the housing body, for accommodating certain of the electronic components and/or access to the components.

As discussed above, the housing body 13 of the electronic device 35 includes a heat dissipation channel 28 extending through the housing body 13 from the front 30 to the rear 32 thereof. The channel 28 is positioned intermediate to (i.e., between) the first and second recesses 14, 16, as best shown in FIG. 10. (The mounts, second recess, and second mounting surface have been partially omitted in FIG. 10 to illustrate the cooling fins and channel.) An array 34 of cooling fins 36 is positioned within the channel 28 and extends longitudinally from front to rear within the channel 28. In an embodiment, the fins 36 are corrugated or otherwise include a plurality of folds.

In an embodiment of the electronic device 35, the cooling fins 36 are cast or otherwise integrally formed with the housing body 13, and are formed from the same material as the housing body 13. In another embodiment, the fins 36 are formed from a material that is different from the material of the housing body 13. In this arrangement, the apparatus 10, comprising the housing body 13 having the heat dissipation channel 28 containing the array 34 of cooling fins 36, functions as an fluid-cooled (e.g., air-cooled) heat sink. In particular, in operation, the electronic components mounted within the first and second recesses 14, 16 of the housing body 13 transfer heat to the housing body 13, and, in turn, to the fins 36. Air passing through the channel 28 serves to dissipate the heat and carry the heat away from the electronic device 35, thereby cooling the electronic device.

In another embodiment of the electronic device, the heat dissipation portion of the apparatus may also be a liquid cooled arrangement cast in, or attached to, the housing body 13. Cooling channels 38, encasing cooling pipes 40, may also be attached to the housing body 13 to aid in heat dissipation performance. In this embodiment, a cooling fluid may be circulated through the housing to further aid in heat dissipation. Moreover, the housing body 13 may have multiple cooling surfaces around the heat dissipation channel 28, allowing for multiple components to be cooled on different surfaces.

The electronic device 35 may be incorporated into a vehicle. For example, in an embodiment, a vehicle comprises a fraction motor, a drive system for electrically powering the traction motor to move the vehicle, and the electronic device, which is part of the drive system. In another embodiment, the vehicle comprises an auxiliary load, an auxiliary system for electrically powering the auxiliary load, and the electronic device, which is part of the auxiliary system. ("Auxiliary" in this context means other than a traction system for moving a vehicle.) In another embodiment, the vehicle includes a traction motor, a drive system for electrically powering the traction motor to move the vehicle, a first electronic device 35 that is part of the drive system, an auxiliary load, an auxiliary system for electrically powering the auxiliary load, and a second electronic device 35 that is part of the auxiliary system. In any of these embodiments (or in other embodiments of a vehicle incorporating an apparatus 10 or an electronic device 35 as described herein), a gross operating weight of the vehicle may be at least 150 metric tons, reflecting that in one aspect, the apparatus/electronic device is configured for a relatively high power output of the type used to power traction and/or auxiliary loads in heavy vehicles.

Figure 12:
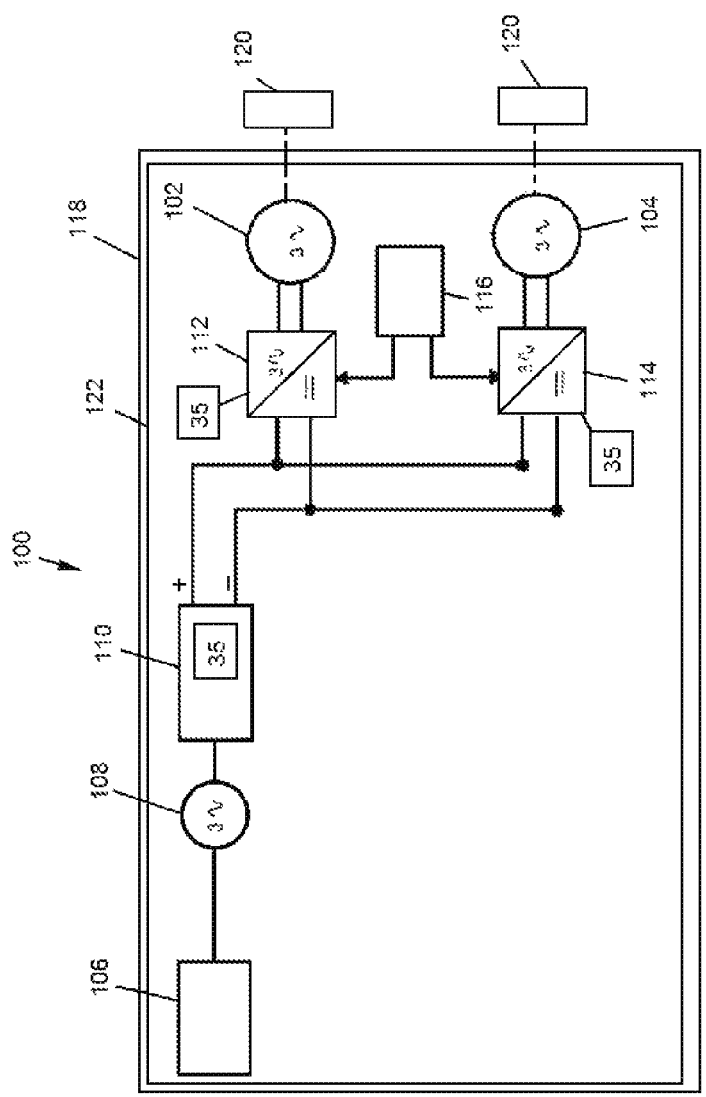
FIG. 12 is a schematic view of a vehicle, according to an embodiment of the invention.

FIG. 12 illustrates a vehicle 100 in which one or more electronic devices 35 may be incorporated. The vehicle 100 includes a vehicle frame 118 and plural wheels 120 operably coupled to the vehicle frame (e.g., via axles and a suspension system). One or more of the wheels 120 may be drive wheels that are coupled to a drive system 122 that provides motive power to the vehicle. The electric drive system 122 is at least partially housed within the vehicle 100, and includes a three-phase alternating current (AC) generator/alternator 108 that is coupled to be mechanically driven by an engine 106 (e.g., a diesel engine). An AC output of the generator 108 is fed into one or more rectifiers 110, which are configured to convert the AC output of the generator/alternator 108 to a direct current (DC) output. The DC output of the rectifiers 110 is supplied to a DC bus, which (among other loads) feeds into a set of inverters 112, 114. The inverters 112, 114 are configured to convert DC power from the DC bus into controlled three-phase, variable frequency AC power. Outputs of the inverters 112, 114 are electrically connected to electric motors 102, 104 (respectively), and the AC power output by the inverters 112, 114 has a waveform suitable for driving the electric motors 102, 104. The electric motors 102, 104 are operably coupled to the drive wheels 120. For example, the motors 102, 104 may be three-phase, AC induction wheel motors. A drive system control unit 116 is electrically coupled to the drive system 122. For example, the drive system control unit may be connected to the inverters 112, 114. The drive system control unit 116, among other tasks, is configured to determine and send a desired torque request signal to the inverters 112, 114. The torque request signal is processed by the control unit for the inverters 112, 114 to drive the motors 102, 104 to the desired torque output magnitude, and in the desired rotational direction corresponding to the intended direction of vehicle movement. The electronic device(s) 35 may be part of the rectifier 110, the inverters 112, 114, or otherwise.

As should be appreciated, the apparatus 10 is multi-functional in that not only does it cool electronic components, but it simultaneously serves as the mounting surface and mechanical housing for the electronic components that it is designed to cool. In this manner, the apparatus 10 functions as an integrated heat-sink and housing that simultaneously mounts, houses, protects, and cools power and control electronics as well as all other hardware relating to the same. As discussed above, in embodiments, components to be cooled can be mounted to either side of the housing body, thereby allowing for simultaneous, dual-sided forced air or other cooling of electronic components.

Moreover, embodiments of the apparatus address the spatial, structural, and cooling issues related to the packaging of power electronics, control electronics, and other hardware required for an electronic device. More particularly, embodiments provide an apparatus for mounting, mechanically packaging, and cooling the power and control electronics and other hardware required for the inverters and secondary H-bridge of the electrification system of mining haul trucks, other off-highway vehicles, and other large vehicles.

Embodiments of the apparatus may reduce packaging costs and improve airflow sealing, which reduces dust and dirt contamination. In addition, the apparatus may be easy to manufacture in relation to existing devices, as a single housing body (e.g., formed by casting) functions to both cool and package the electronic components attached thereto. As embodiments of the apparatus are single, integrated units, the apparatus is more repeatable than existing devices which have multiple parts and therefore suffer from tolerance stack-up issues. In connection with this, by integrating the heat-sink, housing, and mounting surfaces, the number of parts required for an electronic device (incorporating the apparatus) is reduced. Further, in embodiments having a monolithic housing body, hardware mounting of components is simplified, and a weight reduction may be realized over standard plastic materials used for packaging.

Embodiments of the invention are applicable, as noted above, to relatively large vehicles, for example, haul trucks, locomotives, and other vehicles having a gross vehicle operating weight of at least 150 metric tons. However, while the present invention has been described with specific reference to off-highway vehicles and other large vehicles of this type, embodiments of the invention are applicable to vehicles generally, including but not limited to, electric off-highway vehicles, automobiles, and the like.

In an embodiment, an apparatus includes a housing and an array of cooling fins. The housing includes a housing body that defines a first mounting surface configured to receive plural first electronic components to be cooled. The housing body further defines a heat dissipation channel that extends through the housing body under the first mounting surface. The array of cooling fins is disposed in the heat dissipation channel. The housing body is configured to conduct heat from the first electronic components to the cooling fins for transfer of the heat from the cooling fins to a first cooling fluid passing through the heat dissipation channel.

In another embodiment of the apparatus, the housing body defines at least one cooling channel extending through the housing body. The at least one cooling channel is configured to receive a second cooling fluid that is different, and fluidly isolated, from the first cooling fluid.

In another embodiment of the apparatus, the housing body defines a second mounting surface configured to receive plural second electronic components to be cooled. The first mounting surface is positioned on a top side of the housing body and the second mounting surface is positioned on a bottom side of the housing body and with the heat dissipation channel positioned between the first mounting surface and the second mounting surface.

In another embodiment of the apparatus, the housing body defines first and second recesses, and the first mounting surface and the second mounting surface are positioned within the first and second recesses, respectively. The housing body defines respective mounts in the first and second recesses, integral with the housing body, for mounting the plural first electronic components and the plural second electronic components to the first mounting surface and the second mounting surface, respectively.

In another embodiment of the apparatus, the housing body comprises a monolithic metal body.

In another embodiment of the apparatus, the cooling fins are integral with the monolithic metal body.

In another embodiment of the apparatus, the first mounting surface is planar, and the monolithic metal body is generally rectangular cuboid-shaped, and includes top and bottom sides, front and rear sides, and left and right sides. The monolithic metal body defines a first recess in the top side. The first recess is at least partially bound by the first mounting surface and at least two top sidewalls that are perpendicular to the first mounting surface. The at least two top sidewalls are part of at least two of the front and rear sides and left and right sides of the monolithic metal body. The heat dissipation channel extends through the monolithic metal body from the front side to the rear side under the first mounting surface. The heat dissipation channel is substantially coextensive with the first mounting surface.

In another embodiment of the apparatus, the housing further comprises a first cover configured for connection to top edges of the at least two top sidewalls, at the top side of the monolithic metal body, for at least partially enclosing the first recess.

In another embodiment of the apparatus, the monolithic metal body defines a second mounting surface configured to receive plural second electronic components to be cooled. The second mounting surface is planar and is positioned opposite the heat dissipation channel from the first mounting surface on the bottom side of the monolithic metal body. The monolithic metal body defines a second recess in the bottom side. The second recess is at least partially bound by the second mounting surface and at least two bottom sidewalls that are perpendicular to the second mounting surface. The at least two bottom sidewalls are part of at least two of the front and rear sides and left and right sides of the monolithic metal body. The heat dissipation channel is disposed under the second mounting surface and is substantially coextensive with the second mounting surface.

In another embodiment of the apparatus, the housing further comprises a first cover configured for connection to top edges of the at least two top sidewalls, at the top side of the monolithic metal body, for at least partially enclosing the first recess, and a second cover configured for connection to top edges of the at least two bottom sidewalls, at the bottom side of the monolithic metal body, for at least partially enclosing the second recess.

In another embodiment, an electronic device comprises an apparatus (having a housing body with one or two mounting surfaces, as described in any of the embodiments herein), plural first electronic components affixed to the first mounting surface, and (in some embodiments) plural second electronic components affixed to the second mounting surface. A power output of the electronic device, in at least one mode of operation, is from 10 kW to 3000 kW. The electronic device may comprise an H-bridge power converter configured, in one or more of the at least one mode of operation, to convert an electrical input to the power output.

In another embodiment, a vehicle comprises a traction motor and a drive system for electrically powering the traction motor to move the vehicle, and/or an auxiliary load and an auxiliary system for electrically powering the auxiliary load. The drive system and/or the auxiliary system include one or more of the electronic devices (as described in any of the embodiments herein). A gross operating weight of the vehicle is at least 150 metric tons.

In another embodiment, an apparatus includes a housing and an array of cooling fins. The housing includes a monolithic metal body that defines a planar mounting surface configured to receive plural electronic components to be cooled. The monolithic metal body further defines a heat dissipation channel extending through the monolithic metal body under the planar mounting surface. The array of cooling fins is disposed in the heat dissipation channel. The monolithic metal body is configured to conduct heat from the electronic components to the cooling fins for transfer of the heat from the cooling fins to a first cooling fluid passing through the heat dissipation channel. The monolithic metal body is generally rectangular cuboid-shaped, and includes top and bottom sides, front and rear sides, and left and right sides. The monolithic metal body defines a first recess in the top side. The first recess is at least partially bound by the planar mounting surface and at least two top sidewalls that are perpendicular to the planar mounting surface. The at least two top sidewalls are part of at least two of the front and rear sides and left and right sides of the monolithic metal body. The heat dissipation channel extends through the monolithic metal body from the front side to the rear side under the planar mounting surface. The heat dissipation channel is substantially coextensive with the planar mounting surface.

In another embodiment, an electronic device includes an apparatus and plural electronic components. The apparatus includes a housing and an array of cooling fins. The housing includes a monolithic metal body that defines a planar mounting surface to which the plural electronic components are attached. The monolithic metal body further defines a heat dissipation channel extending through the monolithic metal body under the planar mounting surface. The array of cooling fins is disposed in the heat dissipation channel. The monolithic metal body is configured to conduct heat from the electronic components to the cooling fins for transfer of the heat from the cooling fins to a first cooling fluid passing through the heat dissipation channel. The monolithic metal body is generally rectangular cuboid-shaped, and includes top and bottom sides, front and rear sides, and left and right sides. The monolithic metal body defines a first recess in the top side. The first recess is at least partially bound by the planar mounting surface and at least two top sidewalls that are perpendicular to the planar mounting surface. The at least two top sidewalls are part of at least two of the front and rear sides and left and right sides of the monolithic metal body. The heat dissipation channel extends through the monolithic metal body from the front side to the rear side under the planar mounting surface. The heat dissipation channel is substantially coextensive with the planar mounting surface. A power output of the electronic device, in at least one mode of operation, is from 10 kW to 3000 kW.

In another embodiment, a vehicle includes a traction motor and a drive system for electrically powering the traction motor to move the vehicle and/or an auxiliary load and an auxiliary system for electrically powering the auxiliary load. The vehicle further includes one or more electronic devices that are part of the drive system and/or the auxiliary system. A gross operating weight of the vehicle is at least 150 metric tons. Each electronic device includes a respective apparatus and a respective plural electronic components. The apparatus includes a housing and an array of cooling fins. The housing includes a monolithic metal body that defines a planar mounting surface to which the plural electronic components are attached. The monolithic metal body further defines a heat dissipation channel extending through the monolithic metal body under the planar mounting surface. The array of cooling fins is disposed in the heat dissipation channel. The monolithic metal body is configured to conduct heat from the electronic components to the cooling fins for transfer of the heat from the cooling fins to a first cooling fluid passing through the heat dissipation channel. The monolithic metal body is generally rectangular cuboid-shaped, and includes top and bottom sides, front and rear sides, and left and right sides. The monolithic metal body defines a first recess in the top side. The first recess is at least partially bound by the planar mounting surface and at least two top sidewalls that are perpendicular to the planar mounting surface. The at least two top sidewalls are part of at least two of the front and rear sides and left and right sides of the monolithic metal body. The heat dissipation channel extends through the monolithic metal body from the front side to the rear side under the planar mounting surface. The heat dissipation channel is substantially coextensive with the planar mounting surface. A power output of the electronic device, in at least one mode of operation, is from 10 kW to 3000 kW.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in embodiments described herein, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. An apparatus, comprising:
   a housing including a housing body that defines a first mounting surface configured to receive plural first electronic components to be cooled, wherein the housing body further defines a heat dissipation channel that extends through the housing body under the first mounting surface, wherein the housing body comprises a monolithic metal body; and
   an array of cooling fins disposed in the heat dissipation channel;
   wherein the housing body is configured to conduct heat from the first electronic components to the cooling fins for transfer of the heat from the cooling fins to a first cooling fluid passing through the heat dissipation channel; and wherein:
the first mounting surface is planar;
the monolithic metal body is generally rectangular cuboid-shaped, and includes top and bottom sides, front and rear sides, and left and right sides;
the monolithic metal body defines a first recess in the top side, wherein the first recess is at least partially bound by the first mounting surface and at least two top sidewalls that are perpendicular to the first mounting surface, the at least two top sidewalls being part of at least two of the front and rear sides and left and right sides of the monolithic metal body; and
the heat dissipation channel extends through the monolithic metal body from the front side to the rear side under the first mounting surface, the heat dissipation channel being substantially coextensive with the first mounting surface.

2. The apparatus of claim 1, wherein the housing body defines at least one cooling channel extending through the housing body, the at least one cooling channel being configured to receive a second cooling fluid that is different, and fluidly isolated, from the first cooling fluid.

3. The apparatus of claim 1, wherein the housing body defines a second mounting surface configured to receive plural second electronic components to be cooled, the first mounting surface being positioned on a top side of the housing body and the second mounting surface being positioned on a bottom side of the housing body and with the heat dissipation channel positioned between the first mounting surface and the second mounting surface.

4. The apparatus of claim 3, wherein:
the monolithic metal body defines a second, recess, and the first mounting surface and the second mounting surface are positioned within the first and second recesses, respectively; and
the monolithic metal body defines respective mounts in the first and second recesses, integral with the monolithic metal body, for mounting the plural first electronic components and the plural second electronic components to the first mounting surface and the second mounting surface, respectively.

5. The apparatus of claim 1, wherein the housing further comprises a first cover configured for connection to top edges of the at least two top sidewalls, at the top side of the monolithic metal body, for at least partially enclosing the first recess.

6. The apparatus of claim 1, wherein:
the monolithic metal body defines a second mounting surface configured to receive plural second electronic components to be cooled, wherein the second mounting surface is planar and is positioned opposite the heat dissipation channel from the first mounting surface on the bottom side of the monolithic metal body;
the monolithic metal body defines a second recess in the bottom side, wherein the second recess is at least partially bound by the second mounting surface and at least two bottom sidewalls that are perpendicular to the second mounting surface, the at least two bottom sidewalls being part of at least two of the front and rear sides and left and right sides of the monolithic metal body; and the heat dissipation channel is disposed under the second mounting surface and is substantially coextensive with the second mounting surface.

7. The apparatus of claim 6, wherein the housing further comprises:
a first cover configured for connection to top edges of the at least two top sidewalls, at the top side of the monolithic metal body, for at least partially enclosing the first recess; and
a second cover configured for connection to top edges of the at least two bottom sidewalls, at the bottom side of the monolithic metal body, for at least partially enclosing the second recess.

8. An electronic device comprising:
the apparatus of claim 6; and
the plural first electronic components affixed to the first mounting surface; and
the plural second electronic components affixed to the second mounting surface;
wherein a power output of the electronic device, in at least one mode of operation, is from 10 kW to 3000 kW.

9. The electronic device of claim 8, wherein the electronic device comprises an H-bridge power converter configured, in one or more of the at least one mode of operation, to convert an electrical input to the power output.

10. A vehicle comprising:
at least one of: a traction motor and a drive system for electrically powering the traction motor to move the vehicle; or an auxiliary load and an auxiliary system for electrically powering the auxiliary load;
wherein at least one of the drive system or the auxiliary system includes the electronic device of claim 8, and wherein a gross operating weight of the vehicle is at least 150 metric tons.

11. An electronic device comprising:
the apparatus of claim 1; and
the plural first electronic components affixed to the first mounting surface;
wherein a power output of the electronic device, in at least one mode of operation, is from 10 kW to 3000 kW.

12. The electronic device of claim 11, wherein the electronic device comprises an H-bridge power converter configured, in one or more of the at least one mode of operation, to convert an electrical input to the power output.

13. A vehicle comprising:
at least one of: a traction motor and a drive system for electrically powering the traction motor to move the vehicle; or an auxiliary load and an auxiliary system for electrically powering the auxiliary load;
wherein at least one of the drive system or the auxiliary system includes the electronic device of claim 11, and wherein a gross operating weight of the vehicle is at least 150 metric tons.

14. The apparatus of claim 1, wherein the cooling fins are integral with the monolithic metal body such that the fins and housing body are formed of the same piece of metal.

15. An apparatus, comprising:
a housing including a housing body that defines a first mounting surface configured to receive plural first electronic components to be cooled, wherein the housing body further defines a heat dissipation channel that extends through the housing body under the first mounting surface, and wherein the housing body comprises a monolithic metal body; and
an array of cooling fins disposed in the heat dissipation channel;

wherein the housing body is configured to conduct heat from the first electronic components to the cooling fins for transfer of the heat from the cooling fins to a first cooling fluid passing through the heat dissipation channel; and wherein the cooling fins are integral with the monolithic metal body such that the fins and housing body are formed of the same piece of metal.

16. An electronic device comprising:
the apparatus of claim 15; and
the plural first electronic components affixed to the first mounting surface;
wherein a power output of the electronic device, in at least one mode of operation, is from 10 kW to 3000 kW.

17. The electronic device of claim 16, wherein the electronic device comprises an H-bridge power converter configured, in one or more of the at least one mode of operation, to convert an electrical input to the power output.

18. A vehicle comprising:
at least one of: a traction motor and a drive system for electrically powering the traction motor to move the vehicle; or an auxiliary load and an auxiliary system for electrically powering the auxiliary load;
wherein at least one of the drive system or the auxiliary system includes the electronic device of claim 16, and wherein a gross operating weight of the vehicle is at least 150 metric tons.

19. An apparatus, comprising:
a housing comprising a monolithic metal body that defines a planar mounting surface configured to receive plural electronic components to be cooled, wherein the monolithic metal body further defines a heat dissipation channel extending through the monolithic metal body under the planar mounting surface; and
an array of cooling fins disposed in the heat dissipation channel; wherein:
the monolithic metal body is configured to conduct heat from the electronic components to the cooling fins for transfer of the heat from the cooling fins to a first cooling fluid passing through the heat dissipation channel;
the monolithic metal body is generally rectangular cuboid-shaped, and includes top and bottom sides, front and rear sides, and left and right sides;
the monolithic metal body defines a first recess in the top side, wherein the first recess is at least partially bound by the planar mounting surface and at least two top sidewalls that are perpendicular to the planar mounting surface, the at least two top sidewalls being part of at least two of the front and rear sides and left and right sides of the monolithic metal body; and
the heat dissipation channel extends through the monolithic metal body from the front side to the rear side under the planar mounting surface, the heat dissipation channel being substantially coextensive with the planar mounting surface.

20. An electronic device comprising:
the apparatus of claim 19; and
the plural electronic components affixed to the planar mounting surface;
wherein a power output of the electronic device, in at least one mode of operation, is from 10 kW to 3000 kW.

21. A vehicle comprising:
at least one of: a traction motor and a drive system for electrically powering the traction motor to move the vehicle; or an auxiliary load and an auxiliary system for electrically powering the auxiliary load;
wherein at least one of the drive system or the auxiliary system includes the electronic device of claim 20, and wherein a gross operating weight of the vehicle is at least 150 metric tons.

22. The apparatus of claim 19, wherein the cooling fins are integral with the monolithic metal body such that the fins and housing body are formed of the same piece of metal.

23. The apparatus of claim 19, wherein the monolithic metal body defines at least one cooling channel extending through the housing body, the at least one cooling channel being configured to receive a second cooling fluid that is different, and fluidly isolated, from the first cooling fluid.

24. The apparatus of claim 19, wherein the monolithic metal body defines a second recess in the bottom side that is partially bound by another mounting surface configured to receive plural additional electronic components to be cooled, and the heat dissipation channel is positioned between the planar mounting surface and the another mounting surface.

25. The apparatus of claim 19, wherein the housing further comprises:
a cover configured for connection to top edges of the at least two top sidewalls, at the top side of the monolithic metal body, for at least partially enclosing the first recess.

* * * * *